United States Patent [19]

Spletter et al.

[11] Patent Number: 5,008,512

[45] Date of Patent: Apr. 16, 1991

[54] METHOD OF LASER BONDING ELECTRICAL MEMBERS

[75] Inventors: Phillip J. Spletter, Cedar Park; Colin A. MacKay, Austin, both of Tex.

[73] Assignee: Microelectronics and Computer Technology Corporation, Austin, Tex.

[21] Appl. No.: 405,377

[22] Filed: Sep. 8, 1989

[51] Int. Cl.$^5$ ............................................. B23K 26/00
[52] U.S. Cl. ............................ 219/121.64; 219/121.75
[58] Field of Search ........................ 219/121.63, 121.64, 219/121.6, 121.85, 121.75

[56] References Cited

U.S. PATENT DOCUMENTS

| | | | |
|---|---|---|---|
| 4,023,005 | 5/1977 | Bolin | 219/121.85 |
| 4,320,281 | 3/1982 | Cruickshank et al. | 219/121.64 |
| 4,330,699 | 5/1982 | Farrow | 219/121.64 |
| 4,341,942 | 7/1982 | Chaudhari et al. | 219/121.64 |
| 4,394,711 | 7/1983 | Conley | 361/408 |
| 4,404,453 | 9/1983 | Gotman | 219/121.64 |
| 4,471,204 | 9/1984 | Takafuji et al. | 219/121.64 |
| 4,534,811 | 8/1985 | Ainslie et al. | 156/73.1 |
| 4,535,219 | 8/1985 | Sliwa, Jr. | 219/121.63 |
| 4,587,395 | 5/1986 | Oakley et al. | 219/121.64 |
| 4,691,092 | 9/1987 | Verburgh et al. | 219/121.64 |
| 4,697,061 | 9/1987 | Spater et al. | 219/121.64 |
| 4,727,246 | 2/1988 | Hara et al. | 235/488 |
| 4,845,335 | 7/1989 | Andrews et al. | 219/121.63 |

OTHER PUBLICATIONS

Burns et al., "Laser Microsoldering", Apollo Lasers, Inc., Los Angeles, Calif., pp. 115-124.

P. Avramchenko et al., "The Pulsed Laser Welding of Conductors to Films in the Manufacturing of Micro-Devices", Avt. Svarka, 1978, No. 5, pp. 24-26.

K. Okino et al., "Yag Laser Soldering System for Fine Pitch Quad Flat Package (QFP)", IEEE, 1986, pp. 152-156.

E. Lish, "Application of Laser Microsoldering to Printed Wiring Assemblies", Institute for Interconnecting and Packaging Electronic Circuits, IPC TP 538, IPC 28th Annual Meeting, Apr. 1985.

Primary Examiner—C. L. Albritton
Attorney, Agent, or Firm—David M. Sigmond

[57] ABSTRACT

A method is disclosed for laser bonding two highly reflective electrical members. The first electrical member is coated with a material that is well absorbent of laser energy at the laser beam wavelength, has a lower melting point than either the first or second electrical members, and has a low solubility in a solid alloy of the electrical members. The laser characteristics are selected so that as bonding occurs an alloy of the electrical members solidifies and a solidification front drives the molten coating and molten compounds containing the coating away from the bond interface towards the exterior periphery of the bond, and substantially all of the solidified bond interface consists of an alloy of the first and second members. The coating can also aid in wetting the bond interface. In one example a copper electrical member coated with tin is bonded to a gold electrical member using a pulsed YAG laser with a beam diameter of 0.002 inches, a wavelength of 1.064 microns, an energy output of ¼ to ½ joule, and a pulse time of 1 millisecond. Substantially all of the resulting bond interface consists of a copper/gold alloy without any tin intermetallics.

16 Claims, 5 Drawing Sheets

METHOD OF LASER BONDING ELECTRICAL MEMBERS

BACKGROUND OF THE INVENTION

The present invention is directed to using laser bonding to connect two electrical members together. In particular, the present invention is advantageous in inner lead bonding of a tape automated bonding (TAB) tape to the electrical bumps on an integrated circuit die, such as semiconductors. Thermal compression bonding, the current industry standard for inner lead bonding, uses 15,000 psi pressures and 400 degrees C. temperatures which would have a damaging effect if leads were bonded to bonding pads or bumps coated over semiconductor structures, especially as the bonding pads become more miniaturized. Further, thermal compression bonding is commonly optimized to one specific integrated circuit type and different sized circuits require a different set of tooling which is time consuming to replace and re-optimize. In addition the thermode must be cleaned periodically resulting in decreased system throughput. Thermalsonic bonding is also well known, but suffers the drawback that the ultrasonic energy can damage the materials, the speed is limited, and the resolution may not be sufficient for closely pitched bonds.

It is well known that highly reflective metals are difficult to laser bond since laser irradiation occurs in the visible and near-visible regions of the spectrum. For CO2 lasers, this reflectivity is traditionally overcome by coating the metals to be joined with an organic material, such as flux, that absorbs the energy and transfers the heat via thermal conduction. The use of additional coating that must be removed after bonding is undesirable, particularly on devices that have close pitches which makes thorough cleaning difficult. Failure to clean residual organics can degrade the reliability of the circuit. Several solutions have been proposed. U.S. Pat. No. 4,023,005 discloses a method of welding highly reflective metallic members wherein one member is coated with a metal skin of nickel or palladium with low reflectivity to enable welding by a laser. The metal skin is chosen which will not vaporize and as the molten alloy of the metallic members cools a weld nugget alloy is formed containing metal from the metal skin as well as the metallic members. Likewise, U.S. Pat. No. 4,697,061 discloses a method for laser welding a highly reflective covering to a base layer wherein both the covering and the base layer are covered with a metal skin of solder that is less highly reflective of the laser. Each of these prior art techniques, however, suffers the drawback that intermetallics containing the low reflectivity metal and the highly reflective metals occur at the bond interface. At this location these intermetallics can cause reliability problems, especially if the bond is subject to thermal cycling, thermal shock, or mechanical shock. In the case of copper/gold bonds, a tin coating may form brittle intermetallic compounds throughout the entire bond interface.

SUMMARY OF THE INVENTION

The present invention is directed to a method of laser bonding highly reflective metallic electrical members together and includes the provision of coating an electrical member wherein the coating material has the property of being well absorbent of the laser radiation at the wavelength used, has a lower melting point then either electrical member, and has a low solubility in the solid alloy of the electrical members. The laser beam applied to the bond is such that the coating and compounds thereof will be driven to the exterior periphery of the bond as bonding occures.

One of the features of the present invention is to provide the most appropriate laser technology for bonding. The present invention is also directed to the use of particular metal combinations for the electrical members to be bonded together and the laser characteristics which optimize the adhesion between the members and produce stronger bonds.

An object of the present invention is wherein the first electrical member is a copper lead coated with tin, and the second electrical member is a gold bump on an integrated circuit. The tin is preferably three micro-inches thick, and for providing a longer shelf life the tin coating is at least 12 micro-inches thick. Other coatings may be indium, gallium, or suitable mixtures thereof.

Another object of the present invention is to produce a single phase copper/gold alloy, such as 20% copper and 80% gold, at the center of the bond interface between a copper member coated with tin and a gold member, wherein a molten ternary compound of copper/gold/tin is formed by heat from the laser. When the laser is no longer applied the temperature decreases and at 891 degrees C. a copper/gold alloy solidifies at the bond interface, and a solidification front of the copper/gold alloy drives the molten tin and tin compounds away from the bond interface towards the exterior periphery of the bond. When the temperature further decreases to the range of 252 to 451 degrees C., various tin intermetallic compounds solidify exterior to the bond so that substantially all of the bond interface is composed of the copper/gold alloy. The resulting bond interface is essentially free of brittle tin intermetallics and therefore highly reliable.

Another object of the present invention is wherein first and second electrical members are bonded together by a pulsed YAG laser in which the diameter of the laser beam is substantially 0.002 inches, has an energy output of approximately $\frac{1}{8}$ to $\frac{1}{2}$ of a joule in a time of approximately one to two milliseconds, and has a frequency of 1.064 microns.

A further object of the present invention is wherein the coating has the property of wetting the bond interface.

Other and further objects, features and advantages will be apparent from the following description of presently preferred embodiments of the invention, given for the purpose of disclosure, and taken in conjunction with the accompanying drawing.

DESCRIPTION OF THE PREFERRED EMBODIMENT

While the present invention will be described, for purposes of illustration only, by the laser bonding of tape-automated-bonding (TAB) lead frames to integrated circuits, the present method for laser bonding is applicable to bonding other types of highly reflective metallic electrical members to each other.

The present laser bonding method requires that prior to bonding the electrical members be aligned and brought in intimate contact to form an interface. The details of alignment and intimate contact are well known and are not provided herein. U.S. Pat. No. 4,845,335 describes these details for bonding TAB inner leads to integrated circuit bumps in a production oriented system capable of bonding rates in excess of 200 bonds per second, with small leads (less than 50 microns) on close pitches (less than 100 microns). U.S. Pat. No. 4,845,335 is hereby incorporated by reference.

Figure 1:
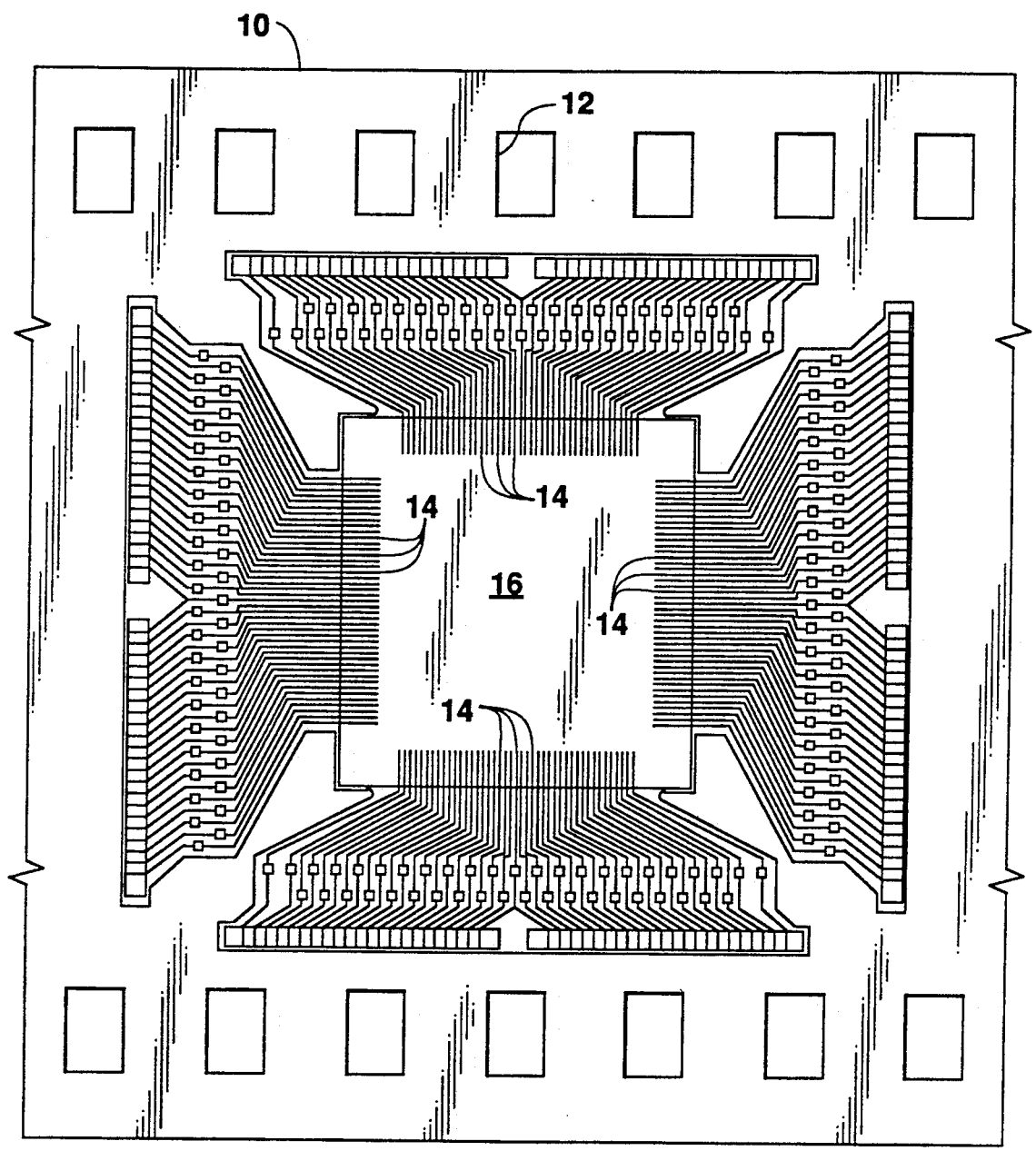
FIG. 1 is a fragmentary enlarged elevational view of a TAB tape with an integrated circuit die in place for bonding.

Referring now to the drawings, and particularly to FIG. 1, the reference numeral 10 generally indicates a portion of a tape automated bonding tape (TAB) having the usual sprocket holes 12 and plurality of highly reflective metallic first electrical members, shown as inner leads 14 for bonding to an integrated circuit die 16 having active semiconductor circuitry.

Current industry standards for TAB inner lead bonding use conventional thermocompression bonding with high pressures and temperatures (currently 15,000 psi and 400 degrees C.) which is acceptable for bonding leads located over bare silicon. Conventional thermocompression bonding is not suitable for bonding over semiconductor structures. However, it would be advantageous to locate the bonding bumps over active circuitry to allow reduction in the cost of the assembled integrated circuits and improve performance by reducing signal path lengths. Furthermore, the yield and reliability of bonds over bare silicon can be increased by greatly reducing heat and pressure.

Figure 2:
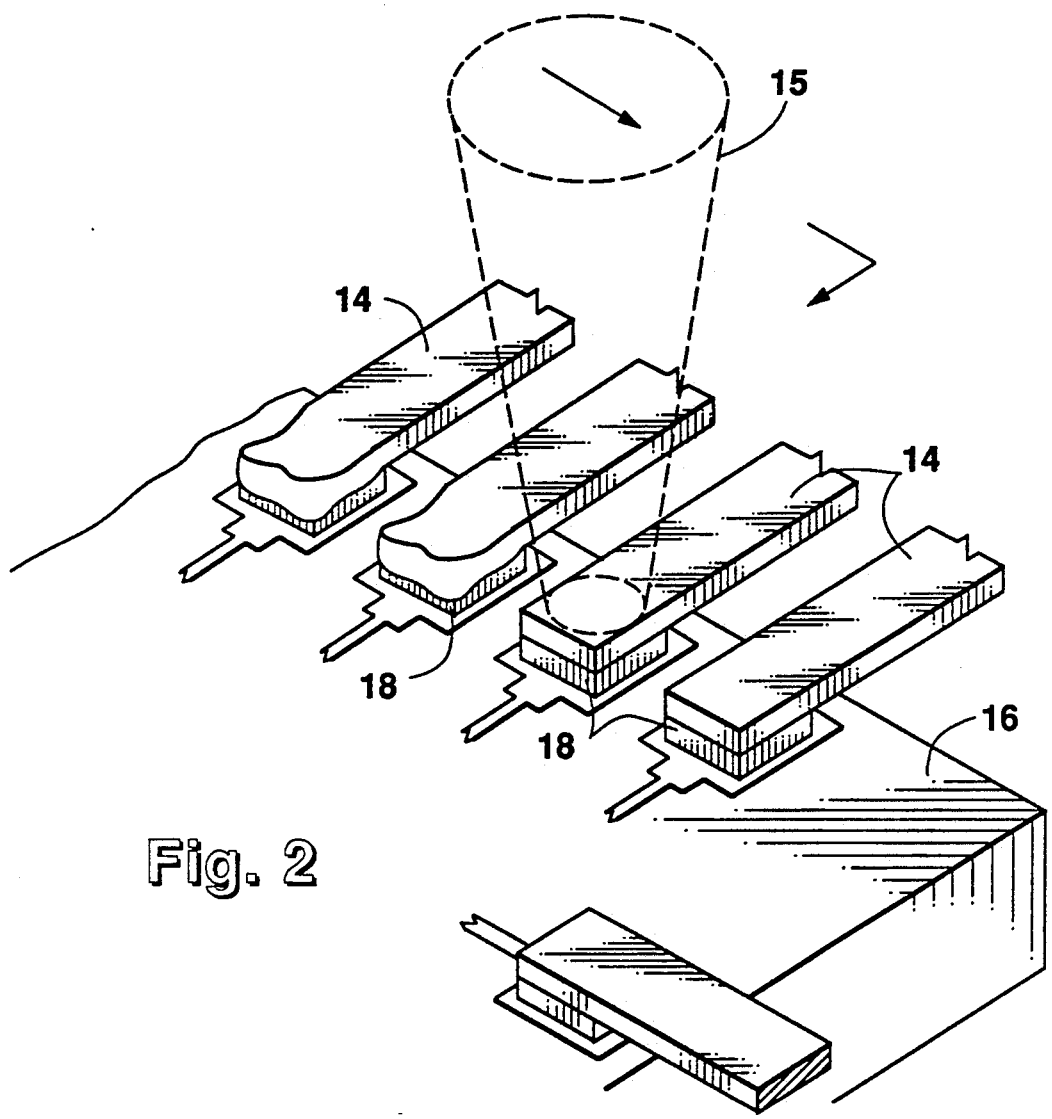
FIG. 2 is a fragmentary perspective view of a laser beam bonding the inner leads of a TAB tape to the bumps on an integrated circuit die.

Thus, the present invention is advantageous by using laser bonding, where a localized, concentrated heating source, a laser beam 15, is used to bond the inner leads 14 to the highly reflective metallic second electrical members, shown as bumps 18 on an integrated circuit die 16, as seen in FIG. 2. In a typical lead-bump connection, the bumps are square bumps 25 microns thick with each side approximately 4.4 mils long. The leads 14 are 1.3 mils thick and 3 mils wide.

The first problem considered is the appropriate laser technologies for bonding the leads 14 to the bumps 18. CO2 lasers have a wavelength of 10.6 microns. Such laser energy is better absorbed by a heat transfer medium such as flux than the metal electrical contacts 14 and 18. However, due to its longer wavelength, a CO2 laser cannot be focused to a small enough spot for bonding the lead 14 and bump 18 and were therefore excluded from consideration.

Since the integrated circuit 16 uses aluminum as a conductor material, and the base material for the leads 14 and bumps 18 are copper and gold, lasers in the spectrum between 0.2 and 0.3 microns wavelength were considered. At these wavelengths energy is well absorbed by the leads 14 and bumps 18 while reflected by the underlying aluminum structures. In this spectrum, excimer lasers were tested. However, it was found that their radiation was so well absorbed that it ablated the molecular bonds rather than merely vibrating them to cause melting and therefore these lasers were rejected.

YAG lasers are solid state lasers with an output that is either continuous wave (CW), shuttered with an acoustical-optic or electro-optic device (Q-switch), or pulsed. They have a wavelength of 1.064 microns. The laser output power as a function of time is different for each of the YAG lasers. It was discovered that these differences have a profound effect upon the suitability of the laser for bonding. A Q-switch laser permits lasing only when the Q-switch is open and there is a kilowatt power spike of several nanoseconds duration at the beginning of each pulse which is capable of drilling a deep small diameter hole in the bond site. As such the Q-switch laser tends to ablate material rather than melt it, as is useful for cutting and drilling but not bonding. The CW laser took considerably more energy to melt the bumps than the Q-switch laser. When enough CW laser power was applied to initiate melting, however, the pulse width could not be sufficiently controlled to prevent damage to the surrounding integrated circuit.

Figure 3:
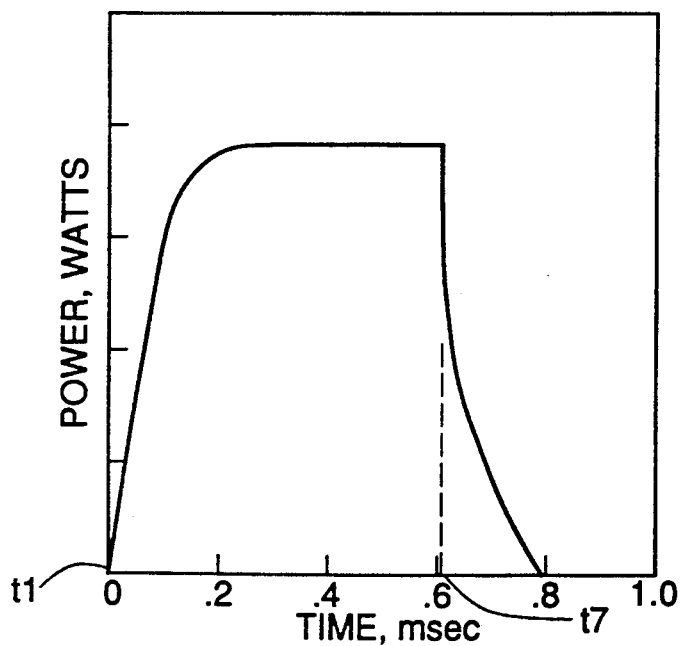
FIG. 3 is a graph showing the wave form of a pulsed YAG laser.

The best test results have been obtained using the pulsed YAG laser. The power versus time curve for a pulsed laser is shown in FIG. 3. In a pulsed laser the flashed lamps are turned on and off for each pulse. As a result, there is an exponential increase in power output until a maximum level is reached at which point the power exponentially decreases. With a pulsed laser, the metals to be bonded are heated to a maximum temperature at which time the energy input exponentially decreases. The pulsed laser provides a higher power level at the middle of the pulse than the Q-switch laser. However, the peak power is orders of magnitude less than the spike at the beginning of the Q-switch pulse. This power preheats the bond site and provides the bond site with the most power when it can use it most efficiently. It also provides decreasing power which tends to allow less internal stress buildup than the instantaneous drop-off of energy that is characteristic of the Q-switch or CW laser. The pulsed YAG laser pulse width was short enough to allow bonding without damaging the surrounding integrated circuit. It was found that a 50 watt average power pulse YAG laser made by Carl Haas GmbH and Co. was satisfactory. It was fitted to a model 44 laser trimmer with linear motor beam positioning equipment from Electro Scientific Industries.

Another factor to be considered in the bonding of the leads 14 to the bumps 18 is the types of materials used. Experiments with a number of lead finishes and bump metallurgies have been performed. It has been found that it is desirable to provide coatings which highly absorb laser energy at the wavelength of the laser used and which have a low solubility in the solid alloy of the leads 14 and bumps 18. Also, since the best electrical conductors, such as copper, gold, silver, and nickel, are highly reflective of light, it is desirable to use highly reflective metallic electrical members. For a YAG laser with a 1.064 micron wavelength, a suitable first electrical member contains a high degree of copper (1.4% energy absorption), a suitable second electrical member contains a high degree of gold (1.5% energy absorption), and a suitable coating material for the first electrical member contains a high degree of tin (53.6% energy absorption).

The amount of free tin on the lead also has a direct bearing on the bondability of the lead. When tin is plated on the leads, initially all of the tin is pure, free tin. Over time, the free tin reacts in the solid state with the copper to form Cu6/Sn5 compound. The longer the tape sits, the thicker the copper/tin compound and the thinner the free tin layer becomes. While the copper/tin compound has a much higher melting point than free tin, it is still considerably lower than the melting point of elemental gold and copper so that it also contributes to the bonding phenomenon described above. However, if the free tin layer is too thin, not enough tin is present to absorb the radiation and initiate an efficient melting/heat transfer process. Experiments show that three micro-inches of free tin is adequate to achieve satisfactory bonds to gold bumps. Experiments have also shown that if the leads are plated with at least twelve micro-inches of electroless tin, the tapes can be stored in a dry box for over two months before a detrimental amount of copper/tin compound is formed.

Most of the bonding experiments were performed using tin plated copper leads over gold bumps. However, experiments with other material combinations have also been performed. For these experiments, leads were either bare copper or copper electroplated with tin, silver, gold, zinc, nickel or indium. All leads were bonded to either gold or copper bumps. With the exception of zinc all of the lead materials bonded to bumps were made from other materials. Zinc has high enough vapor pressure that it boils away before it can flow between the lead and bump to promote heat transfer. Indium, on the other hand, like tin, has a low melting point and a low vapor pressure at its melting point. Bonds that were made with indium plated leads are very similar in appearance to those made with tin plating. Other suitable coatings include gallium and mixtures of tin, gallium and indium. Additionally, if desired, a suitable coating can be alloyed with cadmium, bismuth, or lead to lower the melting point.

Figure 4A:
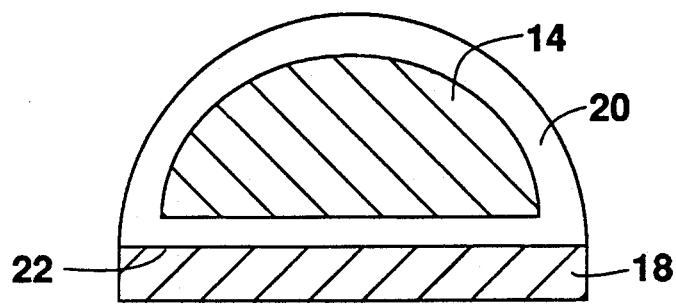
FIG. 4A is a cross-sectional view of a bond site with a coated lead in contact with a bump prior to laser bonding.

Referring now to FIG. 4A, a cross-sectional view of a bond site shows lead 14 coated with a coating 20 aligned and positioned in intimate contact with bump 18 before laser beam 15 is applied.

Figure 4B:
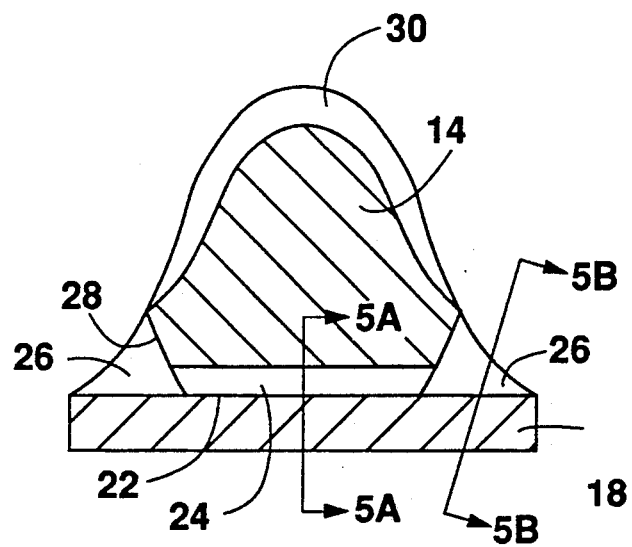
FIG. 4B is a cross-sectional view similar to FIG. 4A showing the bond site after laser bonding has occurred.

Referring now to FIG. 4B, a cross-sectional view of the bond site in FIG. 4A is shown after laser beam 15 has been applied. The uniform interface 22 between lead 14 and bump 18 consists of an alloy 24 throughout the body of the bond formed from the lead 14 and bump 18 with essentially no material from coating 20, as well as an alloy 26 along the periphery of interface 22 and the outer edge 28 of lead 14 which contains a substantial amount of coating 20. In other words, substantially all of bond interface 22 consisted of alloy 24. An additional alloy 30 containing material from lead 14 and coating 20 may solidify along lead exterior 28 away from interface 22. The highest bonding yields have been obtained when copper leads 14 coated with nominal 25 micro-inches of emersion (i.e. electroless) tin 20 were bonded to gold bumps 18. A cross-sectional examination of the bonds indicated that there is a void-free, uniform interface 22 between the lead 14 and the bump 18. An electron microscope scan taken along the interface 22 indicates regions of constant composition indicating the presence of homogenous copper/gold alloys 24 containing no tin intermetallics.

Figure 5A:
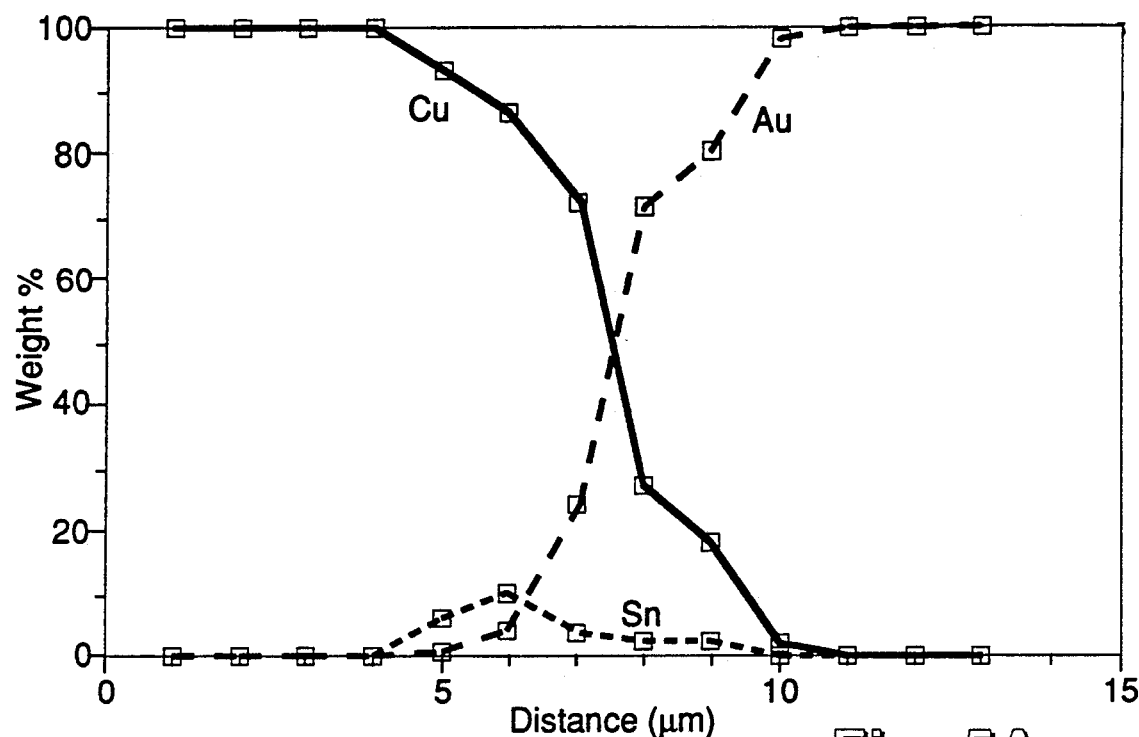
FIG. 5A is an energy dispersive X-ray plot taken along line 5A—5A in FIG. 4B showing the distribution of elements along substantially all of the bond interface.

Referring now to FIG. 5A, the EDX line scans taken along line 5A—5A in FIG. 4B are indicative of substantially all of bond interface 22 and reveal that alloy 24 primarily contains 20% copper and 80% gold, which is the lowest melting point copper/gold solid solution. No significant amount of tin coating 20 was found in the non-peripheral regions of bond interface 22. The steep slopes of the copper and gold curves indicate the narrow region of bond interface 22. This is especially important for high reliability usage in which even small regions of tin intermetallics throughout the bond site, for instance 0.5 to 1.5 microns, are unacceptable since tin intermetallics provide potential fracture paths under stressful conditions such as thermal or mechanical cycling or shock.

Figure 5B:
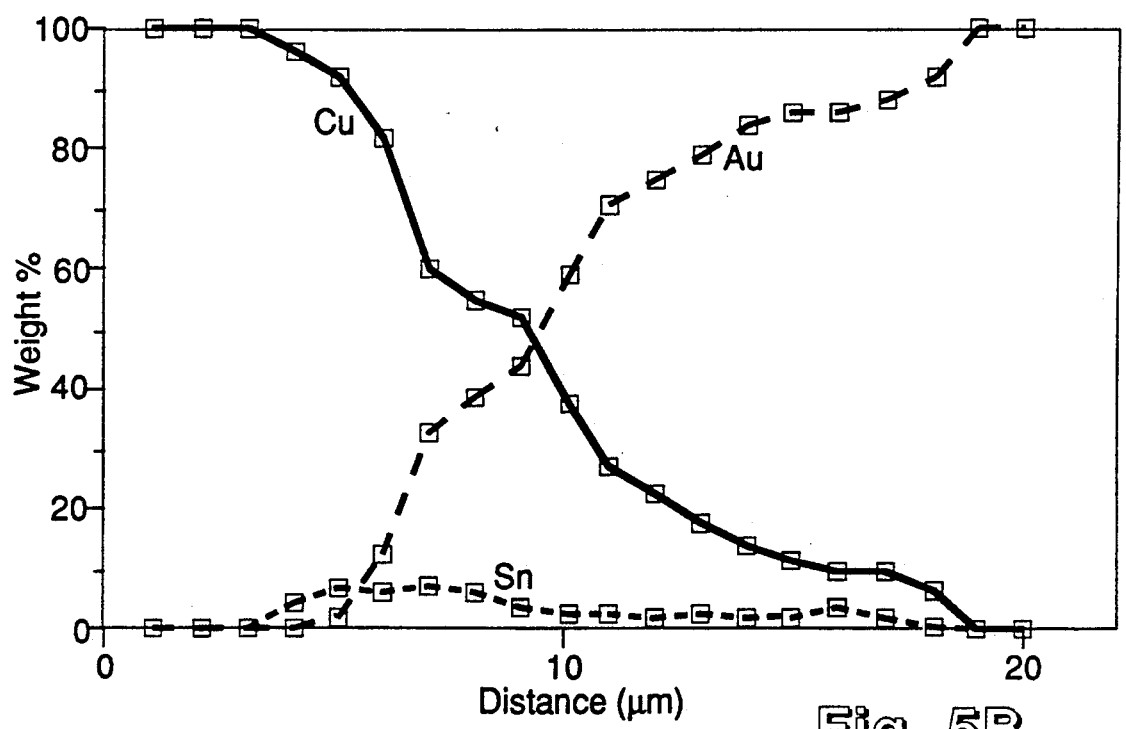
FIG. 5B is an energy dispersive X-ray plot taken along line 5B—5B in FIG. 4B showing the distribution of elements along the exterior periphery of the bond interface.

Referring now to FIG. 5B, the EDX line scans taken along line 5B—5B in FIG. 4B are indicative of the exterior periphery of bond interface 22 and reveal the presence of a higher concentration of potentially brittle tertiary solid solution of copper, gold and tin. The shallow slopes of the scans indicate a broader region of ternary solution than copper/gold alloy 24.

Figure 6:
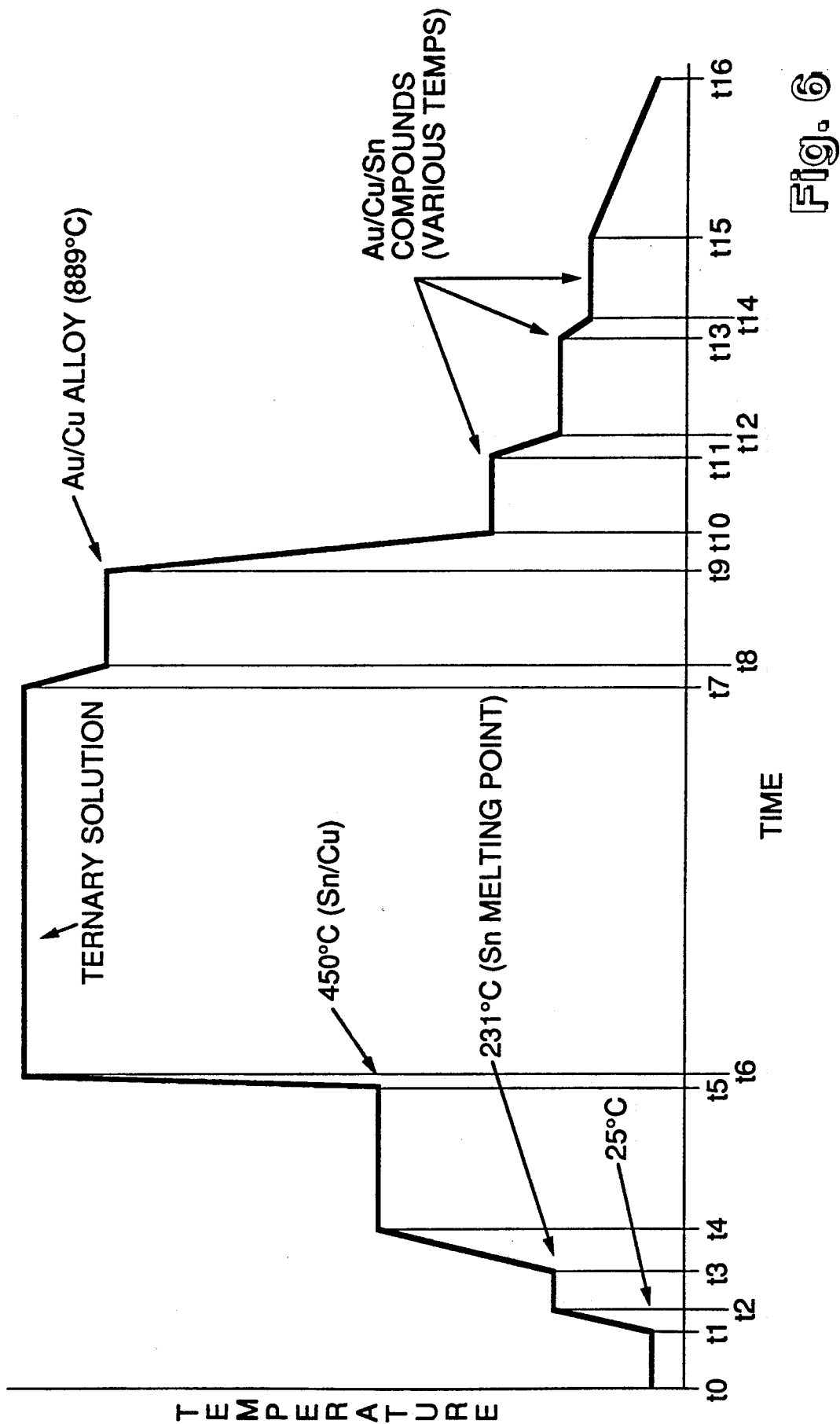
FIG. 6 is a postulated time-temperature relationship of the intermetallic reactions of one embodiment during bond formation.

Referring now to FIG. 6, a postulated time-temperature relationship of intermetallic reactions during a bond formation is shown. At time t0 the bond site is inactive at room temperature. At time t1 the laser beam is applied and the bond site temperature increases. At time t2 the temperature reaches 231 degrees C. and the tin begins to melt. The tin absorbs a high percentage of the incident laser energy, but due to its low vapor pressure does not evaporate. Rather, the molten tin enhances thermal coupling at the bond interface. The tin will later produce intermetallic phases with the copper and the gold. These intermetallic compounds, once formed, melt at a temperature below the melting points of the copper or gold in independent states. This continues until time t3 when all the tin has melted and the temperature rises again. At time t4 a copper/tin alloy begins to form at 450 degrees C. until time t5, when again the temperature rises. At time t6, when the temperature exceeds 889 degrees C., a molten ternary compound containing copper, gold, and tin is formed throughout the bond interface. At time t7, as also shown in FIG. 3, the laser beam is no longer applied to the bond site, and the temperature begins to decrease. At time t8 the temperature drops to 889 degrees C. and a gold/copper 24 alloy begins to solidify near the center of the bond. An advancing solidification front of the gold/copper alloy 24 then extends outwardly toward the periphery of the bond. Since the solubility of the tin in the solid copper/gold alloy is low, the tin is constrained in the still liquid phase, and therefore the solidification front drives the molten tin and molten tin compounds away from the bond interface towards the exterior periphery of the bond. This results in the tin intermetallics solidifying on the exterior periphery of the bond interface, and substantially all of the bond interface 22 containing a copper/gold alloy 24. At time t9 the temperature further decreases until time t10 when the temperature reaches 451 degrees C. Thereafter between times t10 and t15 when the temperature is in the range of 252 to 451 degrees C., successive layers of various tin intermetallic compounds, such as Cu3Sn, Cu5AuSn5, Cu4Au2Sn5, Cu3Au3Sn5, and AuSn4, will solidify at the exterior periphery of the bond interface 22. For instance, at t10 a first gold/copper/tin alloy solidifies in the range of 252 to 451 degrees C. At time t11 the temperature further decreases until time t12 when a second gold/copper/tin alloy solidifies in the range 252 to 451 degrees C. Similarly, at time t13 the temperature decreases again until time t14 when a third gold/copper/tin alloy solidifies in the range of 252 to 451 degrees C. Finally, at time t15 the temperature further decreases until the bond site reaches room temperature at time t16.

After the laser bonding process was developed, consistent, high yield bonds were made. Samples were bonded and subjected to severe environmental testing to access the long term reliability of the process. Most of the environmental tests were performed in accordance with MILSTD-883 and are summarized in table 1:

TABLE 1

| TEST | ENVIRONMENT | DURATION |
|---|---|---|
| autoclave | 121 degrees C., 100% R.H., 15 psig | 96 hours |
| high temp. storage | 150 degrees C. | 1000 hours |
| 85/85 | 85 degrees C., 85% R.H. | 1000 hours |
| moisture resistance | −10 degrees C. at 2.7% R.H. to 65 degrees C. at 95% R.H. | 50 cycles |
| liquid-to-liquid temperature shock | −55 degrees C. to 125 degrees C. | 1000 cycles |
| air-to-air temperature shock | −55 degrees C. to 125 degrees C. | 1000 cycles |

The devices were removed from the environments at periodic intervals and electrically tested. There were no failures of the devices at any of the intervals. After environmental testing was complete, the leads were then pull tested. The data indicated that the entire bond structure remained strong after exposure to the severe environments.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art and which are encompassed within the spirt of the invention, and the scope of the appended claims.

What is claimed is:

1. A method of bonding a first highly reflective metallic electrical member to a second highly reflective metallic electrical member by a laser comprising,
   coating the first electrical member with a material that is well absorbent to the laser energy at the wavelength of the laser, has a lower melting point than either of the electrical members, and has a low solubility in a solid alloy of the electrical members,
   aligning the first and second electrical members with the coating therebetween,
   holding the first and second electrical members in contact with the coating to form an interface, and
   bonding the first and second members at the interface by applying a laser beam, wherein the laser characteristics are selected so that as an alloy of the electrical members solidifies a solidification front will drive the molten coating and molten compounds containing the coating away from the bond interface towards the exterior periphery of the bond, wherein substantially all of the solidified bond interface consists of an alloy of the first and second members, and wherein substantially all of the bond interface strength results from an alloy of the first and second members.

2. The method of claim 1 wherein the laser beam is pulsed.

3. The method of claim 2 wherein the laser is a YAG laser.

4. The method of claim 3 wherein the laser beam wavelength is approximately 1.064 microns.

5. The method of claim 3 wherein the laser beam has a diameter of approximately 0.002 inches.

6. The method of claim 3 wherein the laser beam has an energy output of approximately ⅛ to ½ joule at the bond site.

7. The method of claim 3 wherein the laser beam has a pulse time of approximately one to two milliseconds.

8. The method of claim 1 wherein the coating material is selected from the group consisting of tin, indium, and gallium.

9. The method of claim 1 wherein the coating material is selected from a mixture of the group consisting of tin, indium, and gallium.

10. The method of claim 1 wherein the first electrical member is copper and the second electrical member is gold.

11. The method of claim 1 wherein the coating has the property of wetting the bond interface.

12. A method of bonding a first electrical member containing a high degree of copper to a second electrical member containing a high degree of gold by a pulsed YAG laser comprising,
    coating the first electrical member with a material containing a high degree of tin,
    aligning the first and second electrical members with the coating therebetween,
    holding the first and second electrical members in contact with the coating to form an interface, and
    bonding the first and second members together at the interface by applying a laser beam, wherein the laser characteristics are selected so that as a copper/gold alloy solidifies a solidification front will drive the molten tin and molten compounds containing tin away from the bond interface towards the exterior periphery of the bond, wherein substantially all of the solidified bond interface consists of a copper/gold alloy, and wherein substantially all of the bond interface strength results from a copper/gold alloy of the first and second members.

13. The method of claim 12 wherein the laser beam has a diameter of approximately 0.002 inches, a wavelength of approximately 1.064 microns, an energy output of approximately ⅛ to ½ joule, and a pulse time of approximately one to two milliseconds.

14. The method of claim 13 wherein the coating material is at least three micro-inches thick.

15. The method of claim 13 wherein the coating material is at least twelve micro-inches thick.

16. The method of claim 13 wherein the copper/gold alloy contains approximately 20% copper and 80% gold.

* * * * *